United States Patent [19]
Huff et al.

[11] Patent Number: 6,100,689
[45] Date of Patent: Aug. 8, 2000

[54] METHOD FOR QUANTIFYING GHOST ARTIFACTS IN MR IMAGES

[75] Inventors: Steven J. Huff, Hartland; Joseph K. Maier, Milwaukee; Anders Per Olof Hörnblad, Lake Mills; Gopal B. Avinash, New Berlin, all of Wis.

[73] Assignee: General Electric Company, Milwaukee, Wis.

[21] Appl. No.: 09/145,932

[22] Filed: Sep. 3, 1998

[51] Int. Cl.$^7$ ................................................ G01V 3/00
[52] U.S. Cl. ........................... 324/309; 324/318; 324/314
[58] Field of Search .................... 324/309, 314, 324/318, 312

[56] References Cited

U.S. PATENT DOCUMENTS 5,672,969  9/1997  Zhou et al. .................... 324/309
5,729,140  3/1998  Kruger et al. .................. 324/309

OTHER PUBLICATIONS

Magnetic resonance in Medicine, vol 34, 632–638, 1995, Xin Wan et al., Reduction of Phase Error Ghosting Artifacts in Thin Slice Fast Spin Echo Imaging.

*Primary Examiner*—Christine K. Oda
*Assistant Examiner*—Brij B. Shrivastav
*Attorney, Agent, or Firm*—Quarles & Brady; Christian G. Cabou; Phyllis Y. Price

[57] ABSTRACT

The ghost artifacts appearing in images produced by an MRI system are measured. An image of a reference phantom is acquired and the ghost artifacts are measured by cross correlating a ghost correlation matrix with the image. The ghost correlation matrix is produced from the image and the cross correlation is computed as the ghost correlation matrix is moved across the image along either the phase encoding or frequency encoding axes.

9 Claims, 5 Drawing Sheets

METHOD FOR QUANTIFYING GHOST ARTIFACTS IN MR IMAGES

BACKGROUND OF THE INVENTION

The field of the invention is nuclear magnetic resonance imaging methods and systems. More particularly, the invention relates to the measurement and quanitification of ghost artifacts in MR images.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated, this signal may be received and processed to form an image.

When utilizing these signals to produce images, magnetic field gradients ($G_x$ $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The quality of a reconstructed MR image depends on many factors. One of these factors is the phase of the acquired NMR signal. In the well known Fourier transform (FT) imaging technique, which is frequently referred to as "spin-warp", for example, the phase and frequency of the NMR signal produced by spin magnetization determines the location of the spins in the reconstructed image. As discussed in an article entitled "Spin-Warp NMR Imaging and Applications to Human Whole-Body Imaging" by W. A. Edelstein et al., *Physics in Medicine and Biology*, Vol. 25, pp. 751–756 (1980), the Fourier transform method of imaging employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a "frequency encoding" direction orthogonal to the phase encoding direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed.

If the NMR measurements are not accurately made and either the phase or frequency of the acquired NMR signals is affected, so-called ghost artifacts will appear in the phase encoding direction and produce bright areas in the reconstructed image to either side of their true location. Similarly, frequency errors misplace spin magnetization in the frequency encoding direction and produce one or more ghost artifacts displaced from their true location.

Ghost artifacts can be caused by many factors and the level of ghost artifacts in an MR image is one measure of the operation of the MRI system. Unfortunately, there is no objective measure of the amount of ghosting, and hence, no quantitative measure of the performance of the MRI system.

SUMMARY OF THE INVENTION

The present invention is a method for quantitatively measuring the amount of ghosting occurring in an MR image. More particularly, the method includes performing a scan with an MRI system to acquire NMR data from a reference phantom located in a region of interest; reconstructing an image using the acquired NMR data; producing a ghost correlation matrix; sliding the ghost correlation matrix across a portion of the image and calculating the cross correlation between the ghost correlation matrix and the image; displaying a quantitative measure of the ghost artifacts in the image based on the calculated cross correlation.

A general object of the invention is to quantitatively measure the ghost artifacts in an MR image. The ghost correlation matrix represents a reference ghost and the cross correlation indicates the magnitude of the ghosting appearing in the image. This cross correlation data may be used in a number of ways to present a quantitative measure of the ghosting occurring in the MR image.

DESCRIPTION OF THE PREFERRED EMBODIMENT

Figure 1:
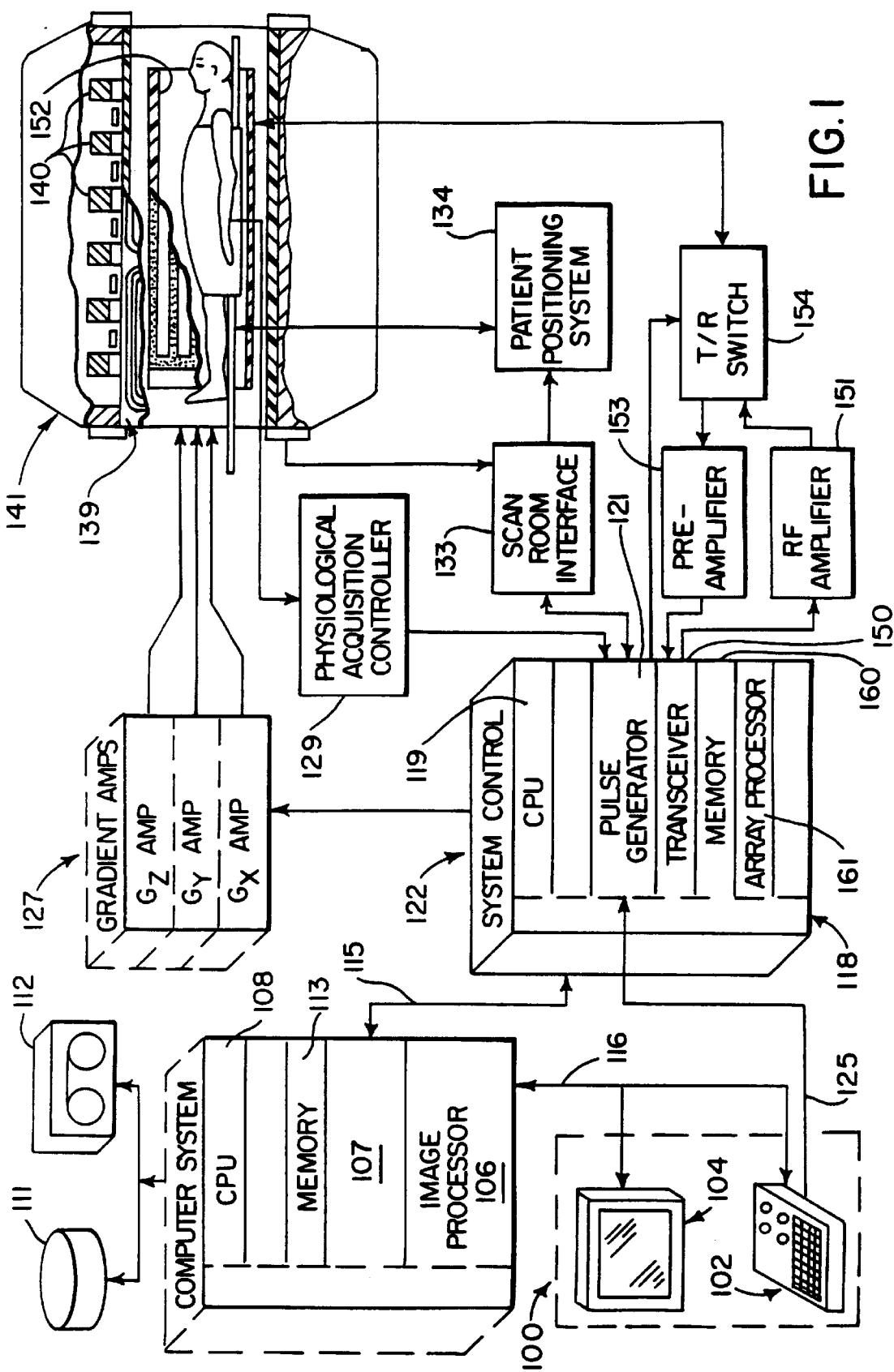
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

For a more detailed description of the transceiver 150, reference is made to U.S. Pat. Nos. 4,952,877 and 4,992,736 which are incorporated herein by reference.

The present invention is a method for operating the MRI system of FIG. 1 to provide a quantitative measure of the ghost artifacts produced in its images. This is also a quantitative measure of the operating condition of the MRI system, and it may, therefore, be made available to the service engineer as part of the tools used to evaluate system performance. It is also available to research users who are evaluating the operation of newly developed pulse sequences. As will become apparent from the description below, the method is implemented in the MRI system of FIG. 1 under the direction of a program stored in the computer system 107.

Figure 2:
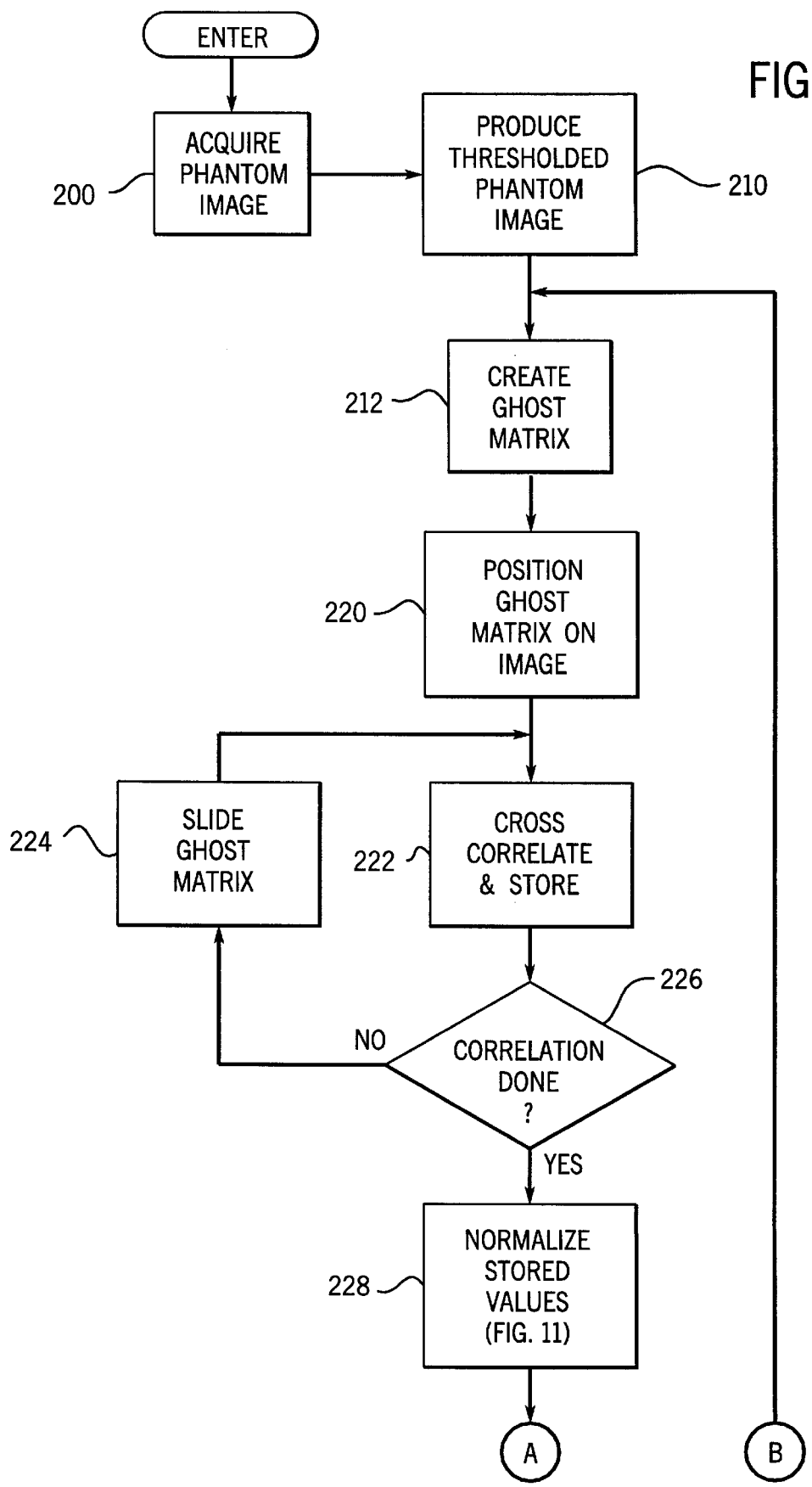
FIGS. 2 and 3 are a flow chart of the steps employed in the preferred embodiment of the invention.

Referring particularly to FIG. 2, the first step in the process is to acquire an image of a phantom placed in the region of interest as indicated at process block 200. The phantom employed in the preferred embodiment is a 20 cm sphere filled with a 0.014 Molar Nickel Chloride solution. It can be appreciated, however, that the present invention can be used with a phantom of any geometric shape and size, and any solution which produces an NMR signal may be used. The important factor is that the NMR signal produced by the phantom is homogeneous throughout its geometric extent.

Figure 4:
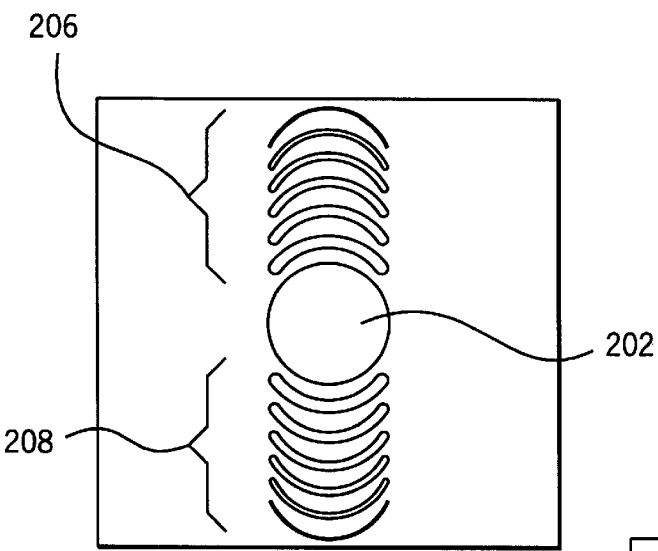
FIG. 4 is a pictorial representation of an image acquired by the MRI system of FIG. 1 to practice the preferred embodiment of the present invention.
Figure 5:
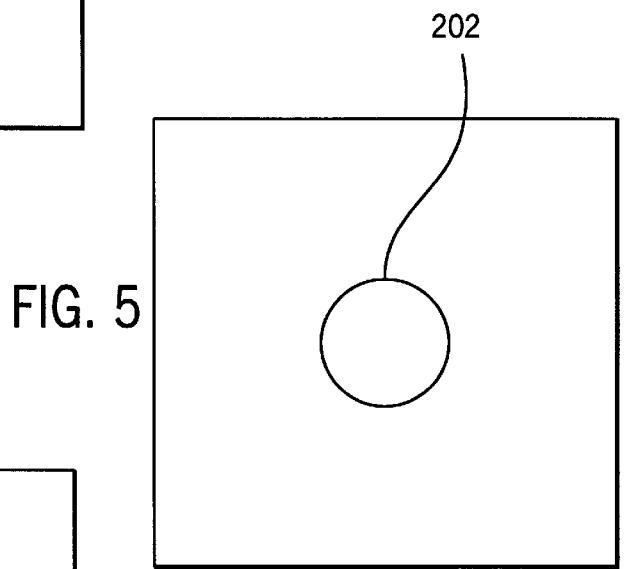
FIG. 5 is a pictorial representation of a thresholded copy of the image of FIG. 4.

Any imaging pulse sequence may be used, and indeed, one of the purposes of the present invention is to measure the quality of the images produced with existing or newly developed pulse sequences. An image such as that shown in FIG. 4 is reconstructed from the acquired NMR data, where the phantom is depicted as a circle 202 and ghosts 204 and 206 are produced in the vertical, phase encoding directions. This original image is saved and a threshold copy of the image is produced at process block 210. As shown in FIG. 5, the threshold is set to filter out all the ghosts such that only the spherical phantom 202 is depicted in the thresholded image.

Figure 6:
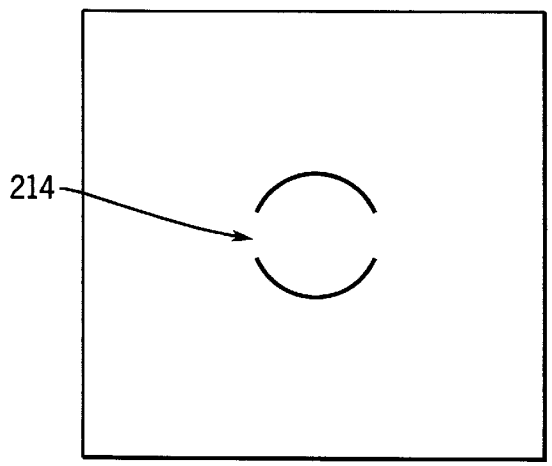
FIG. 6 is a pictorial representation of the image of FIG. 5 after application of an edge detector.
Figure 7:
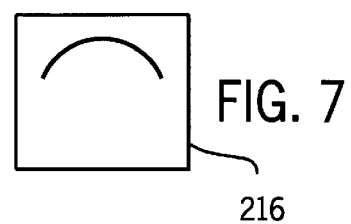
FIGS. 7 and 8 are ghost correlation matrices employed in the preferred embodiment of the present invention.
Figure 8:
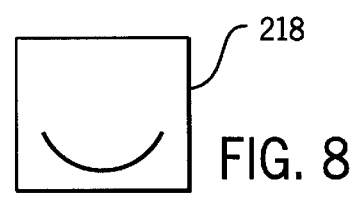

Referring still to FIG. 2, the next step as indicated at process block 212 is to create a ghost correlation matrix which emulates the ghost artifact produced by the phantom. This is achieved by producing a binary mask image (not shown) from the thresholded image of the phantom in which the phantom pixels are set to "1" and the background pixels are set to "0". A Laplacion edge detector is then applied to this binary image in the vertical direction to produce an edge matrix 214 as illustrated in FIG. 6. All non-zero pixels are set to "1" and background pixels are set to "0", and then the image is cropped and divided to form an upper ghost correlation matrix 216 shown in FIG. 7 and a lower ghost correlation matrix 218 shown in FIG. 8.

It should be apparent that a ghost correlation matrix that emulates ghosts produced in the horizontal, frequency encoding direction can also be produced. In such case, the Laplacion edge detector is applied to the binary image of the phantom in the horizontal direction, and the resulting edge matrix is divided to form a left and right ghost correlation matrix.

Figure 9:
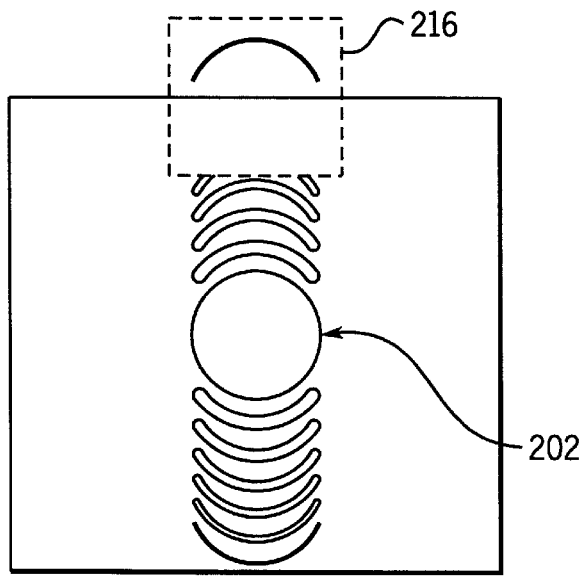
FIG. 9 is a pictorial representation of a correlation process which forms part of the method of the present invention.
Figure 10:
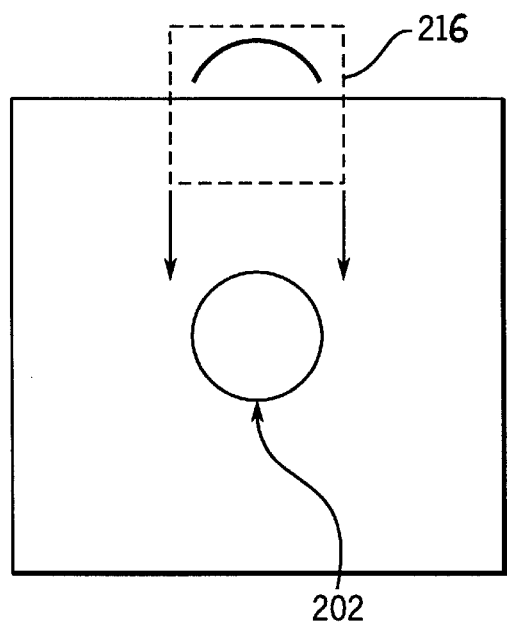
FIG. 10 is a pictorial representation of a second correlation process used in the preferred embodiment of the invention.
Figure 11:
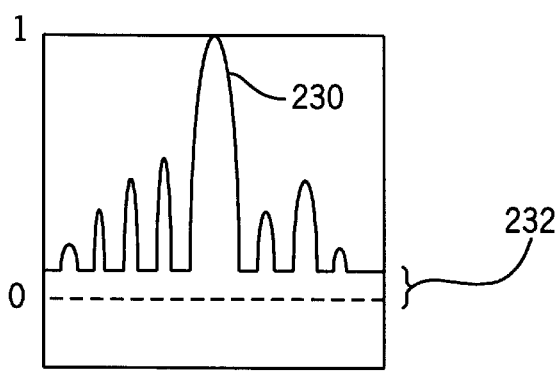
FIGS. 11–13 are graphic representations of the 1D arrays of data produced by correlation steps in the preferred embodiment of the invention.

Referring again to FIG. 2, the ghost correlation matrix 216 is positioned as indicated in process block 220 for cross correlation purposes on the upper edge of the original image, directly above the phantom image 202. This is illustrated in FIG. 9 where the center of the ghost matrix 216 is associated with a pixel on the upper edge of the original image and other pixels in the ghost matrix 216 are associated with the corresponding surrounding pixels in the original image. A loop is then entered in which the ghost matrix 216 is cross correlated with corresponding pixels in the original image as indicated at process block 222 to produce a 1D array of correlation values. As is well known, the cross correlation is the sum of the product of each pixel in the ghost matrix (i.e. "0" or "1") times the magnitude of the corresponding pixel in the original image. The resulting cross correlation value is stored in a one-dimensional array and the ghost matrix 216 is then moved, or slid, one pixel downward as indicated at process block 224. The cross correlation process is repeated and the values stored in the 1D array until the ghost matrix 216 reaches the lower edge of the original image as determined at decision block 226. The cross correlation values stored in the 1D array are then normalized with respect to the peak value as indicated at process block 228. If the normalized values in the 1D array are plotted as a function of pixel location of the ghost matrix, the graph appears as shown in FIG. 11.

Figure 14:
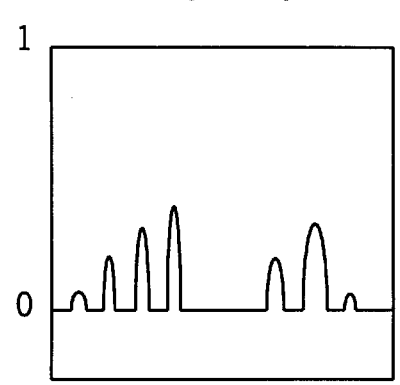
FIG. 14 is a graphic representation of a 1D array of correlation data that measures the ghost artifacts in the MR image of FIG. 4.

A number of steps are now performed to isolate the cross correlation values in the 1D array which are attributable to ghosting. Referring to FIG. 11, the central lobe of cross correlation values 230 are produced by the phantom itself. In addition, the low-level values of the background pixels in the original image produce a dc offset indicated at 232. These values will now be identified and removed from the 1D array of cross correlation values to produce an array containing only ghost artifacts as illustrated in FIG. 14.

Figure 3:
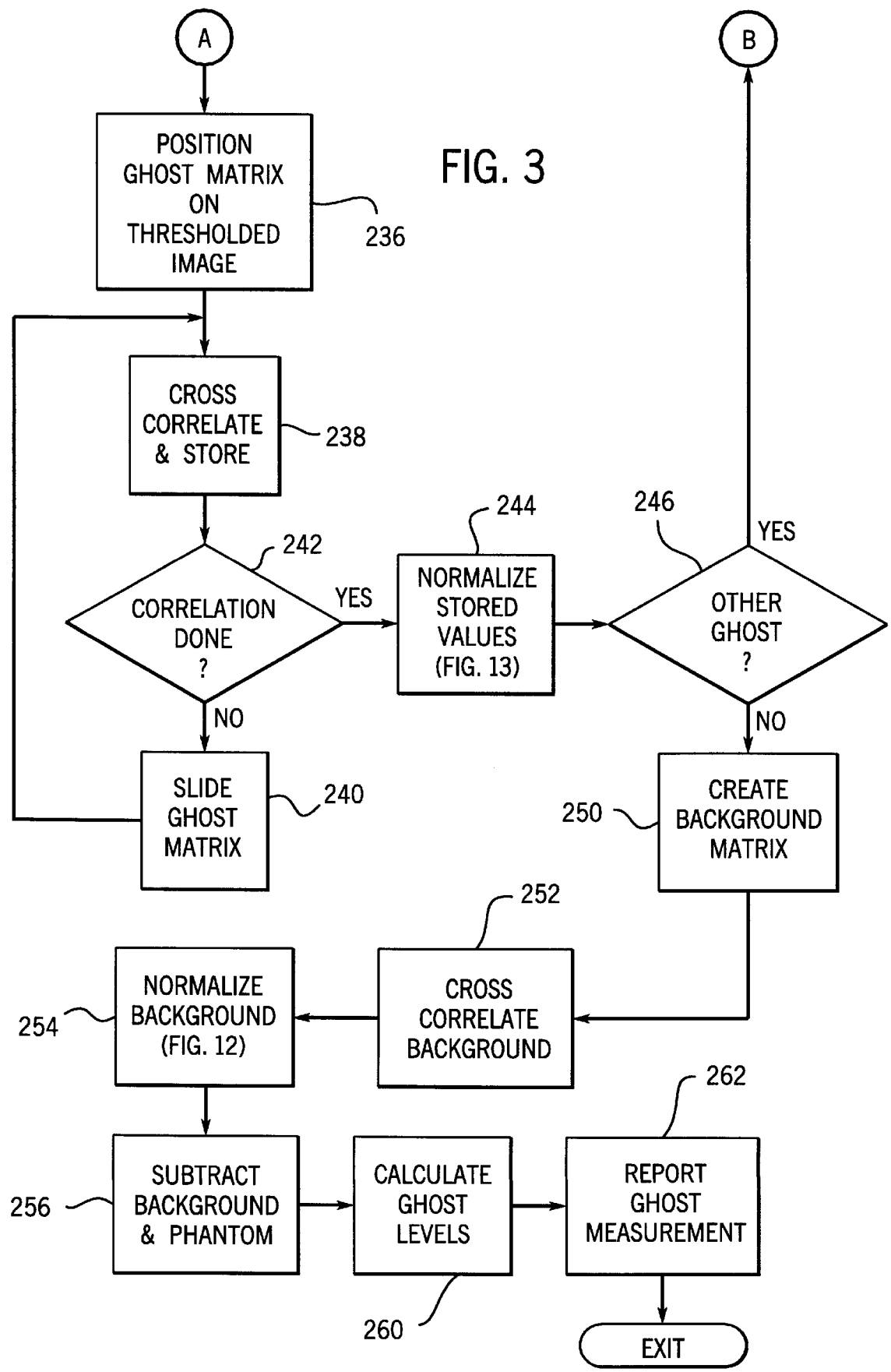

Referring particularly to FIG. 3, to remove the phantom cross correlation values the ghost matrix is positioned on the thresholded image as indicated at process block 236. A loop is entered in which a second 1D cross correlation array is produced using the thresholded image (i.e. no ghosts in the image). More particularly, the cross correlation of the ghost correlation matrix 216 and corresponding pixels in the thresholded image is calculated at process block 238 and the ghost matrix 216 is moved one pixel as indicated at process block 240. When the ghost matrix 216 has traversed the entire image, as determined at decision block 242, the cross correlation values are normalized as indicated at process block 244 to produce a 1D array of values corresponding to the cross correlation of the ghost matrix with the phantom image. These normalized values are indicated graphically in FIG. 13.

As indicated at decision block 246 in FIG. 3, the above process may be repeated with additional ghost correlation matrices. For example, the lower ghost correlation matrix 218 may be employed in the cross correlation process and further ghost matrices may be created to measure ghosts produced along the horizontal, frequency encoding, axis. The resulting 1D cross correlation array from each separate ghost matrix is stored and used in the following steps to arrive at a quantitative measure of the image ghosting.

Figure 12:
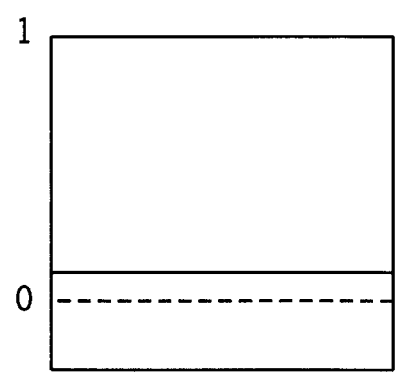

The next step in the process is to measure the effect of the background level on the cross correlation values. This is achieved by first creating a background matrix as indicated at process block 250, and cross correlating the pixels therein with the pixels in a patch of background in the original image as indicated at process block 252. The background matrix is formed by counting the number of "1" pixels in the ghost correlation matrix 216 and creating a square matrix having the same number of pixels all set to "1". This may be cross correlated with a corresponding patch of pixels in a corner of the original image, or more than one background patch can be correlated and the results averaged. The result is normalized as indicated at process block 254 to produce a "dc" background cross correlation value such as that illustrated in FIG. 12.

The cross correlation values for the ghost alone are isolated by subtracting the phantom cross correlation values (FIG. 13) and the background cross correlation values (FIG. 12) from the 1D array of image cross correlation values (FIG. 11) as indicated at process block 256. The result is a 1D array of cross correlation values illustrated graphically in FIG. 14 which measure the number and the intensity level of ghost artifacts.

Figure 13:
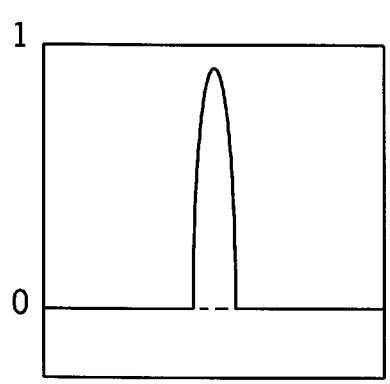

As indicated at process block 260, a number of calculations can then be performed on the 1D array of ghost artifact values to quantify their magnitude. These quantities may be calculated on the separate ghost artifact arrays (FIG. 14) produced by each separate ghost correlation matrix, or they may all be combined and a single set of quantities calculated. In either case, the peak cross correlation ghost value is determined, the integral of the cross correlation ghost artifact values is calculated, and the mean value of the cross correlation ghost artifact values is calculated. The ghost artifact measurements are reported at process block 262 as:

1) the ratio of the integral of the ghost artifacts (FIG. 14) to the integral of the background level;

2) the ratio of the mean value of the ghost artifacts (FIG. 14) to the mean value of the background level; and 3) the peak ghost artifact value (FIG. 14) as a percentage of the peak correlation value of the phantom (FIG. 13).

While the largest ghost artifacts are typically produced in the phase encoding direction, it should be apparent that the present invention may be employed to measure ghost artifacts in either the phase encoding direction, frequency encoding direction, or both.

What is claimed is:

1. A method for measuring ghost artifacts in images produced by an MRI system, the steps comprising:

a) acquiring and reconstructing an image of a reference phantom using the MRI system;

b) producing a ghost correlation matrix;

c) cross correlating the ghost correlation matrix with the image to produce a cross correlation array of values;

d) producing a ghost artifact array by subtracting from the cross correlation array those values attributable to the reference phantom;

e) calculating a measure of the ghost artifacts using the values in the ghost artifact array.

2. The method as recited in claim 1 in which the ghost correlation matrix is produced using data in the reconstructed image.

3. The method as recited in claim 2 in which the ghost correlation matrix is produced by:

thresholding the reconstructed image to remove ghost artifacts therein;

detecting an edge of the phantom depicted in the reconstructed image; and producing the ghost correlation matrix from the detected edge of the phantom.

4. The method as recited in claim 1 in which the cross correlation in step c) is performed by sliding the ghost correlation matrix over the reconstructed image along a phase encoding direction and calculating the cross correlation at a plurality of locations to produce corresponding values for the cross correlation array.

5. The method as recited in claim 1 in which step d) is performed by:

thresholding the reconstructed image to remove ghost artifacts therein;

cross correlating the ghost correlation matrix with the thresholded image to produce a phantom cross correlation array; and subtracting the phantom cross correlation array from the cross correlation array.

6. The method as recited in claim 1 which includes:

subtracting from the cross correlation array those values attributable to the background signal in the reconstructed image.

7. The method as recited in claim 1 in which step e) includes:

calculating the mean value of the ghost artifact array.

8. The method as recited in claim 1 in which step e) includes:

determining the peak value of the ghost artifact array.

9. The method as recited in claim 1 in which step e) includes:

calculating the integral of the values in the ghost artifact array.

\* \* \* \* \*